(12) United States Patent
Isoda (10) Patent No.: US 6,433,630 B1
(45) Date of Patent: Aug. 13, 2002

(54) PHASE SHIFTER, AND DEMODULATOR EMPLOYING IT

(75) Inventor: Hiroshi Isoda, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/650,723

(22) Filed: Aug. 30, 2000

(30) Foreign Application Priority Data

Aug. 30, 1999 (JP) .............................................. 11-243188

(51) Int. Cl.[7] .................................................. H03D 7/14
(52) U.S. Cl. ........................ 329/307; 329/306; 329/308; 455/304; 455/315; 455/323; 455/260
(58) Field of Search ................................. 329/307, 306, 329/308; 455/260, 323, 314, 315, 304

(56) References Cited

U.S. PATENT DOCUMENTS 5,410,368 A * 4/1995 Krishnamurthy et al. ... 455/260

FOREIGN PATENT DOCUMENTS

JP A955629 2/1997

* cited by examiner

*Primary Examiner*—Arnold Kinkead (57) ABSTRACT

In a demodulator, a local oscillator 7 feeds a local oscillation signal having a frequency of f/n to a phase shifter 8. In the phase shifter 8, all-pass filters 9 and 10 produce two oscillation signals separated in phase by 90/n degrees from each other, which are then fed individually to n-times frequency multiplier 11 and 12. The n-times frequency multipliers 11 and 12 multiply the frequency of those oscillation signals by a factor of n and thereby produce two carriers having a frequency of f and separated in phase by 90 degrees from each other, which are then fed to mixers 2 and 3.

24 Claims, 5 Drawing Sheets

PHASE SHIFTER, AND DEMODULATOR EMPLOYING IT

BACKGROUND OF THE INVENTION

1. Field of the Invention

The present invention relates to a 90° phase shifter, and more specifically to a 90° phase shifter for use in a direct conversion tuner used in a digital satellite broadcast receiver. The present invention relates also to a demodulator employing such a phase shifter.

2. Description of the Prior Art

In recent years, with the development of satellite communication techniques, digital satellite broadcasting has come into operation on the basis of such satellite communication techniques. In a receiver for digital satellite broadcasts, a direct conversion tuner is used that is provided with a demodulator that performs quadrature demodulation on a received signal to demodulate it into a baseband signal. Such a demodulator is provided with a phase shifter that outputs two signals separated in phase by 90° from each other. Now, a conventional phase shifter will be described with reference to the drawings.

Figure 7:
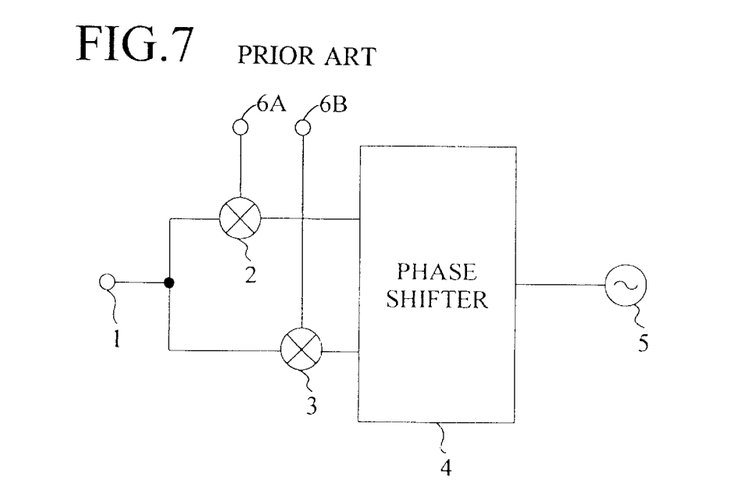
FIG. 7 is a block diagram showing the internal configuration of a conventional demodulator.

FIG. 7 shows a quadrature demodulator employing a conventional phase shifter. The quadrature demodulator shown in FIG. 7 has an input terminal 1 at which it receives a received signal, a mixer 2 that produces an I baseband signal from the received signal fed from the input terminal 1, a mixer 3 that produces a Q baseband signal from the received signal fed from the input terminal 1, a phase shifter that generates two oscillation signals separated in phase by 90° from each other from a local oscillation signal fed from a local oscillator 5, a local oscillator 5, an output terminal 6A to which the I baseband signal is delivered from the mixer 2 for output, and an output terminal 6B to which the Q baseband signal is delivered from the mixer 3 for output.

Figure 8:
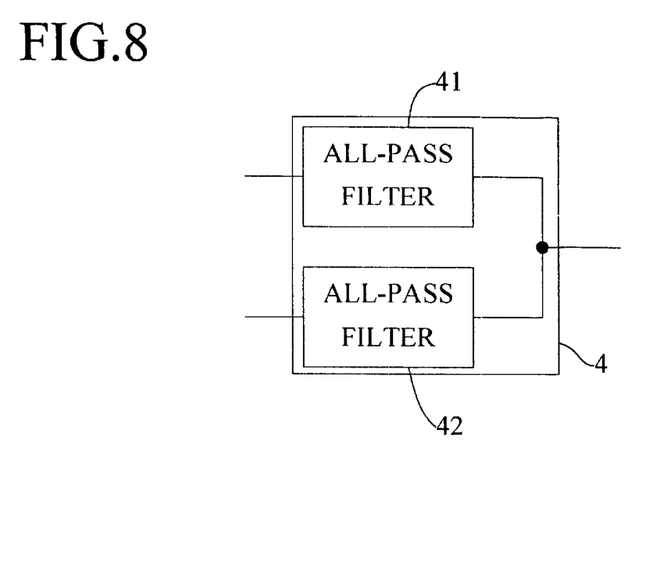
FIG. 8 is a block diagram showing the internal configuration of a phase shifter.

In this demodulator configured as described above, the phase shifter 4 is, as shown in FIG. 8, composed of an all-pass filter 41 that produces from the local oscillation signal an oscillation signal separated in phase by 45° therefrom and feeds the produced signal to the mixer 2 and an all-pass filter 42 that produces from the local oscillation signal an oscillation signal separated in phase by 135° therefrom and feeds the produced signal to the mixer 3. Thus, through the operation of the all-pass filters 41 and 42 provided within the phase shifter 4, the phase shifter 4 outputs two oscillation signals that are used as two carriers separated in phase by 90° from each other.

Figure 9:
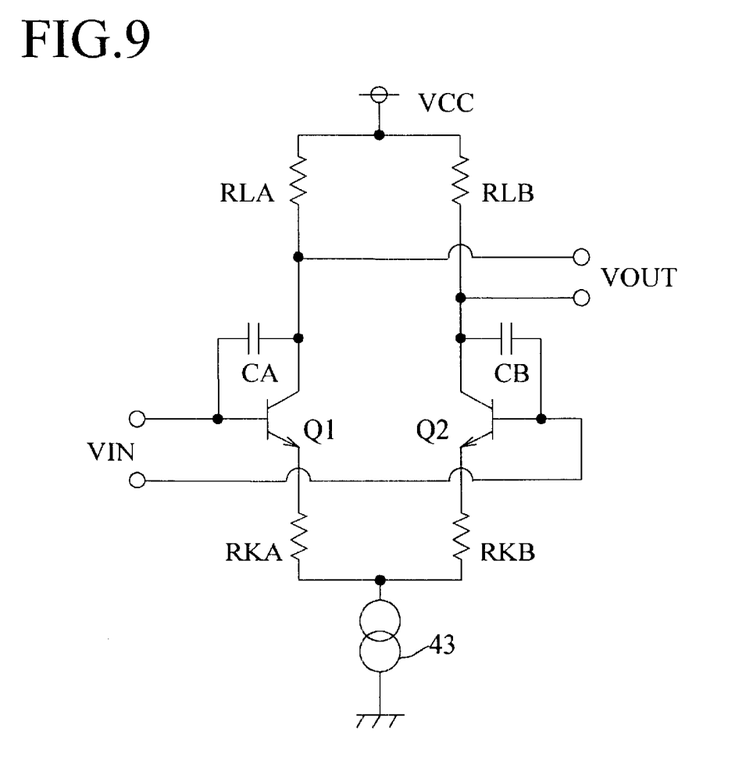
FIG. 9 is a circuit diagram showing the internal configuration of an all-pass filter.

The all-pass filters 41 and 42 are each composed of circuit elements as shown in FIG. 9, specifically npn-type transistors Q1 and Q2, resistors RLA and RLB connected to the collector of the transistors Q1 and Q2 respectively, resistors RKA and RKB connected to the emitter of the transistors Q1 and Q2 respectively, capacitors CA and CB connected between the collector and base of the transistors Q1 and Q2 respectively, and a constant current source 43 connected to the node between the resistors RKA and RKB. In addition, a supply voltage VCC is applied to the node between the resistors RLA and RLB.

In the all-pass filter shown in FIG. 9, an input signal VIN fed between the bases of the transistors Q1 and Q2 causes an output signal VOUT to appear between the node connecting the collector of the transistor Q1 to the resistor RLA and the node connecting the collector of the transistor Q2 to the resistor RLB. Now, suppose that the resistors RKA, RKB, RLA, and RLB all has a resistance R, and that the capacitors CA and CB both has a capacitance C. Then, the gain Gv of this all-pass filter configured as described above is given by formula (1) below. Hence, the phase characteristic between the input signal VIN and the output signal VOUT is expressed by formula (2) below. It is to be noted that ω represents 2πf, assuming that the input signal VIN has a frequency of f.

$$Gv = \frac{(1 - j\omega CR)}{(1 + j\omega CR)} \quad (1)$$

$$\phi = -2 \tan^{-1}(\omega CR) \quad (2)$$

Since the phase characteristic of the all-pass filter is expressed by formula (2), the product CR of the resistance R and the capacitance C of the resistors and capacitors used in the all-pass filter is given by formula (3) below.

$$CR = \frac{\tan\left(-\frac{\phi}{2}\right)}{\omega} \quad (3)$$

Hence, when a local oscillation signal having a frequency of 1 [GHz] is fed to the all-pass filter 41, which should yield an output signal separated in phase by 45° from the input signal fed thereto, formula (3) requires that the value of CR be equal to $6.592 \times 10^{-11}$. In this way, in the all-pass filter 41 to which a high-frequency local oscillation signal is fed, the product RC of the resistance R and the capacitance C of the resistors and capacitors used therein needs to be considerably small, and thus the resistance R and the capacitance C need to be accordingly small.

However, making the resistance R of the resistors smaller requires increasing the areas of the resistors, and is accompanied by an increased influence of the parasitic capacitance appearing in the resistive films of the resistors. On the other hand, making the capacitance C of the capacitors smaller makes the influence of the stray capacitance of the wiring pattern laid in the all-pass filter too great to ignore. As a result, when the phase shifter is formed in an integrated circuit, the higher the frequency of the signal it needs to handle, the lower its accuracy.

Moreover, in a demodulator employing such a phase shifter, the frequency of the received signal fed in via its input terminal is equal to the frequency of the local oscillation signal generated by the local oscillator provided therein. This causes the local oscillation signal to leak back to the input terminal by way of the signal, power, and ground lines. In addition, conversely, the received signal destabilizes the operation of the local oscillator that generates the local oscillation signal having the same frequency as the received signal, and thereby causes the frequency of the local oscillation signal to fluctuate, thus causing also the frequencies of the I baseband and Q baseband signals output from the demodulator to fluctuate.

SUMMARY OF THE INVENTION

An object of the present invention is to provide a phase shifter, and a demodulator employing it, that generates high-frequency local oscillation signals separated in phase by 90° from each other.

Another object of the present invention is to make it possible to manufacture such a phase shifter with a high degree of integration.

To achieve the above object, according to one aspect of the present invention, a phase shifter is provided with: a phase shifting portion that produces, from a local oscillation signal having a frequency of f/n (where n is a natural number), two signals separated in phase by 90/n degrees from each other; and a frequency multiplying portion that performs frequency multiplication on each of the two signals output from the phase shifting portion by a frequency multiplication factor of n so that the frequency of those signals is converted from f/n to f and that makes those signals separated in phase by 90 degrees from each other.

According to another aspect of the present invention, a demodulator is provided with: a phase shifter including a phase shifting portion that produces, from a local oscillation signal having a frequency of f/n (where n is a natural number), two signals separated in phase by 90/n degrees from each other and a frequency multiplying portion that performs frequency multiplication on each of the two signals output from the phase shifting portion by a frequency multiplication factor of n so that the frequency of those signals is converted from f/n to f and that makes those signals separated in phase by 90 degrees from each other; a first mixer that produces an I baseband signal by multiplying a received signal fed in from outside by one of the two signals output from the phase shifter; and a second mixer that produces a Q baseband signal by multiplying the received signal fed in from outside by the other of the two signals output from the phase shifter.

BRIEF DESCRIPTION OF THE DRAWINGS

This and other objects and features of the present invention will become clear from the following description, taken in conjunction with the preferred embodiments with reference to the accompanying drawings in which.

DESCRIPTION OF THE PREFERRED EMBODIMENTS

First Embodiment

Figure 1:
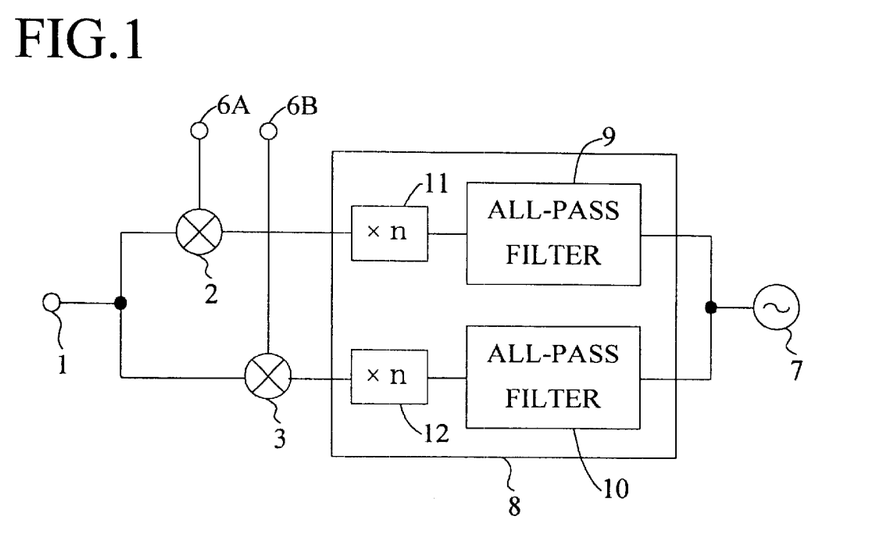
FIG. 1 is a block diagram showing the internal configuration of the demodulator of a first embodiment of the invention.

A first embodiment of the present invention will be described with reference to the drawings. FIG. 1 is a block diagram showing the internal configuration of the demodulator of this embodiment. In the demodulator shown in FIG. 1, such circuit elements as are used for the same purposes as in the demodulator shown in FIG. 7 are identified with the same reference numerals, and their detailed descriptions will not be repeated.

The demodulator shown in FIG. 1 has an input terminal 1 at which it receives a received signal having a frequency of f, mixers 2 and 3, a local oscillator 7 that generates a local oscillation signal having a frequency of f/n (where n is a natural number), an all-pass filter 9 that shifts the phase of the oscillation signal having the frequency of f/n by $\phi°$, an all-pass filter 10 that shifts the phase of the oscillation signal having the frequency of f/n by $(\phi+90/n)°$, n-times frequency multipliers 11 and 12 that individually multiply the oscillation signals output from the all-pass filters 9 and 10 by a factor of n, and output terminals 6A and 6B. Here, the all-pass filters 9 and 10 and the n-times frequency multipliers 11 and 12 together constitute a phase shifter 8. The all-pass filters 9 and 10 used in this embodiment are configured in the same manner as in conventional demodulators, i.e. as shown in FIG. 9.

In the demodulator configured as shown in FIG. 1, the local oscillation signal having the frequency of f/n output from the local oscillator 7 is fed to each of the all-pass filters 9 and 10, so that an oscillation signal having a phase shifted by $\phi°$ and having a frequency of f/n and an oscillation signal having a phase shifted by $(\phi+90/n)°$ and having a frequency of f/n are fed respectively to the n-times frequency multipliers 11 and 12. At this time, the oscillation signals output from the all-pass filters 9 and 10 are separated in phase by $90/n°$ from each other. Then, the n-times frequency multipliers 11 and 12 individually multiply the frequency of the oscillation signals output from the all-pass filters 9 and 10 by a factor of n, so that carriers having a frequency of f are fed to the mixers 2 and 3.

At this time, the n-times frequency multipliers 11 and 12 multiply, by a factor of n, the phase of the oscillation signal output from the all-pass filter 9 to $n \times \phi°$ and the phase of the oscillation signal output from the all-pass filter 10 to $n \times (\phi+90/n)°$. Thus, the carriers that are fed from the phase shifter 8 to the mixers 2 and 3 are separated in phase by 90° from each other. In this way, the phase shifter 8 feeds the mixers 2 and 3 individually with carriers that are separated in phase by 90° from each other, and, by these carriers, the mixers 2 and 3 multiply the received signal having the frequency of f and thereby produce an I baseband signal and a Q baseband signal, which are then delivered to the output terminals 6A and 6B for output.

As described above, the all-pass filters 9 and 10 provided within the phase shifter 8 receive a local oscillation signal having a frequency lower than the frequency of the received signal. This makes it possible to give the resistors and capacitors used in those all-pass filters 9 and 10 a greater resistance and a greater capacitance than in conventional circuit configurations. Moreover, the received signal and the local oscillation signal have different frequencies. This helps reduce the influence of those signals on each other.

Second Embodiment

Figure 2:
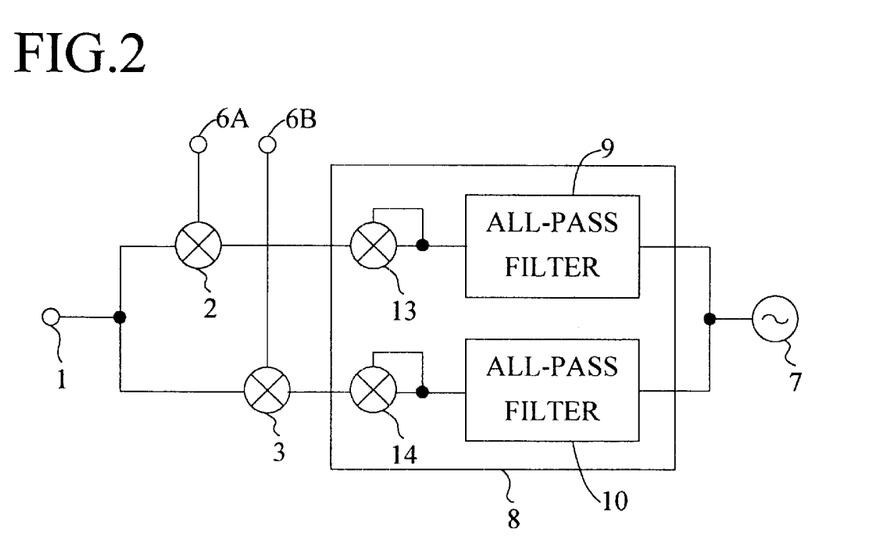
FIG. 2 is a block diagram showing the internal configuration of the demodulator of a second embodiment of the invention.

A second embodiment of the present invention will be described with reference to the drawings. FIG. 2 is a block diagram showing the internal configuration of the demodulator of this embodiment. In the demodulator shown in FIG. 2, such circuit elements as are used for the same purposes as in the demodulator shown in FIG. 1 are identified with the same reference numerals, and their detailed descriptions will not be repeated. This embodiment is a practical example of the first embodiment in which n=2. That is, the local oscillator 7 generates a local oscillation signal having a frequency of f/2, and the all-pass filters 9 and 10 produce oscillation signals that are separated in phase by 90°/2, i.e. 45°, from each other.

The demodulator shown in FIG. 2 has an input terminal 1, mixers 2 and 3, a local oscillator 7 that oscillates a local oscillation signal having a frequency of f/2, all-pass filters 9 and 10, multipliers 13 and 14 that produce carriers by multiplying the oscillation signals output from the all-pass filters 9 and 10 by themselves respectively and feed the produced carriers to the mixers 2 and 3, and output terminals 6A and 6B. Here, the all-pass filters 9 and 10 and the multipliers 13 and 14 together constitute a phase shifter 8. The multipliers 13 and 14 correspond to the n-times frequency multipliers 11 and 12 in the first embodiment. In this embodiment, the all-pass filters 9 and 10 produce oscillation signals having phases shifted by 67.5° and 112.5° respectively from the local oscillation signal.

In this demodulator configured as described above, when the received signal fed in via the input terminal 1 has a frequency of 1 [GHz], the local oscillation signal has a frequency of 0.5 [GHz]. Thus, the local oscillation signal having the frequency of 0.5 [GHz] is fed to the all-pass filters 9 and 10, which produce therefrom oscillation signals having phases shifted by 67.5° and 112.5° respectively therefrom and then feed them to the multipliers 13 and 14. The multipliers 13 and 14 multiply those oscillation signals by themselves, with the result that their frequency is multiplied by a factor of 2 to 1 [GHz] and their phases are also multiplied by a factor of 2 to 135° and 225° respectively. Thus, the phase shifter 8 feeds the mixers 2 and 3 with carriers having a frequency of 1 [GHz] and separated in phase by 90° from each other, and the mixers 2 and 3 produce therefrom an I baseband signal and a Q baseband signal, which are then delivered to the output terminals 6A and 6B for output.

Here, the value of the product CR of the resistance R and the capacitance C of the resistors and capacitors used in the all-pass filters 9 and 10, as calculated using formula (3) noted earlier, is $2.127 \times 10^{-10}$ with the all-pass filter 9 and $4.765 \times 10^{-10}$ with the all-pass filter 10, i.e. greater than in conventional circuit configurations. This helps prevent degradation in accuracy when these circuit elements are formed in an integrated circuit.

Third Embodiment

Figure 3:
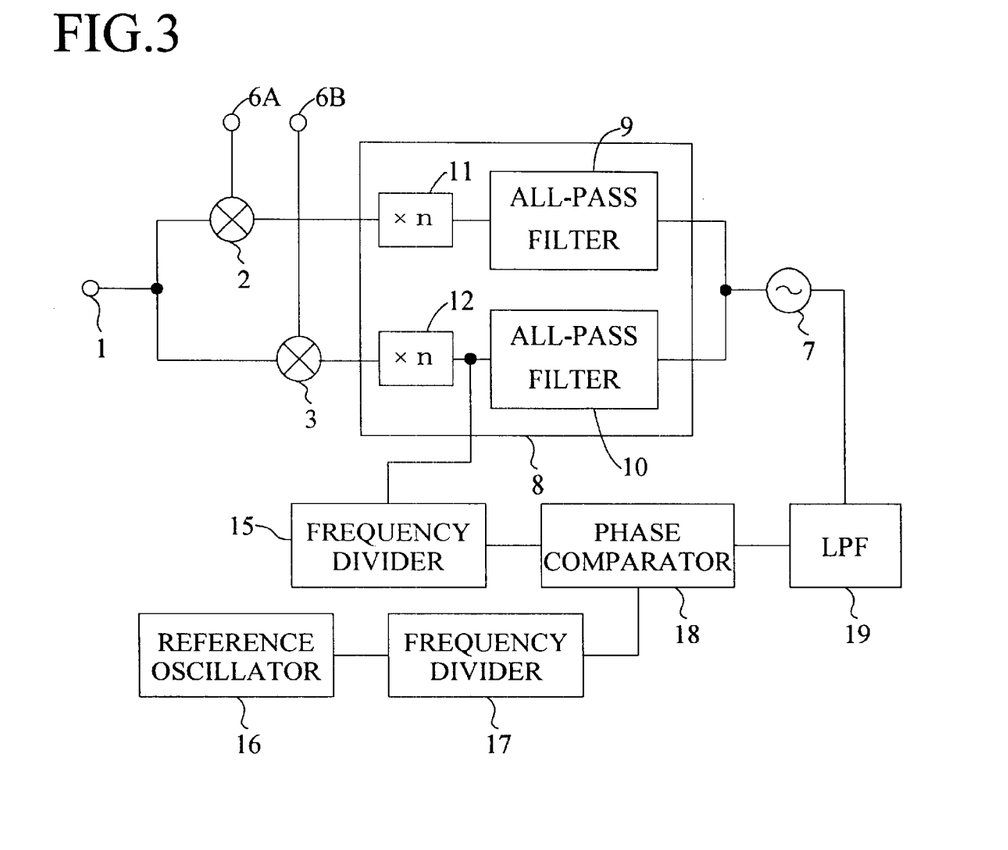
FIG. 3 is a block diagram showing the internal configuration of the demodulator of a third embodiment of the invention.

A third embodiment of the present invention will be described with reference to the drawings. FIG. 3 is a block diagram showing the internal configuration of the demodulator of this embodiment. In the demodulator shown in FIG. 3, such circuit elements as are used for the same purposes as in the demodulator shown in FIG. 1 are identified with the same reference numerals, and their detailed descriptions will not be repeated. The modulator of this embodiment differs from that of the first embodiment only in that it is additionally provided with a phase-locked loop (PLL).

The demodulator shown in FIG. 3 has, in addition to the same circuit elements constituting the demodulator shown in FIG. 1, a frequency divider 15 that divides the frequency of the oscillation signal output from the all-pass filter 10 by a factor of N (i.e. performs 1/N frequency division), a reference oscillator 16 that oscillates a reference signal having a frequency of f0, a frequency divider 17 that divides the frequency of the reference signal output from the reference oscillator 16 by a factor of Nx (i.e. performs 1/Nx frequency division), a phase comparator 18 that compares the phases of the signals output from the frequency dividers 15 and 17, and a low-pass filter 19 that eliminates high-frequency components from the signal output from the phase comparator 18. Moreover, the local oscillator 7 is built as a voltage-controlled oscillator so as to be voltage-controlled by the signal output from the low-pass filter 19.

Here, the local oscillator 7, the all-pass filter 10, the frequency dividers 15 and 17, the reference oscillator 16, the phase comparator 18, and the low-pass filter 19 together constitute a PLL. Forming a PLL in this way permits the local oscillator 7 to generate a local oscillation signal having a stable frequency.

Moreover, in the demodulator configured as described above, the frequency divider 15 may be a variable frequency divider that permits the frequency division factor to be varied at will. This makes it possible to vary the local oscillation signal generated by the local oscillator 7 and thereby select a desired received signal to be subjected to quadrature demodulation from among a plurality of received signals fed in via the input terminal 1. Furthermore, in this modulator that permits selection of a desired received signal to be subjected to quadrature demodulation from among a plurality of received signals fed in via the input terminal 1, the divider 17 also may be a variable frequency divider that permits the frequency division factor to be varied at will.

Fourth Embodiment

Figure 4:
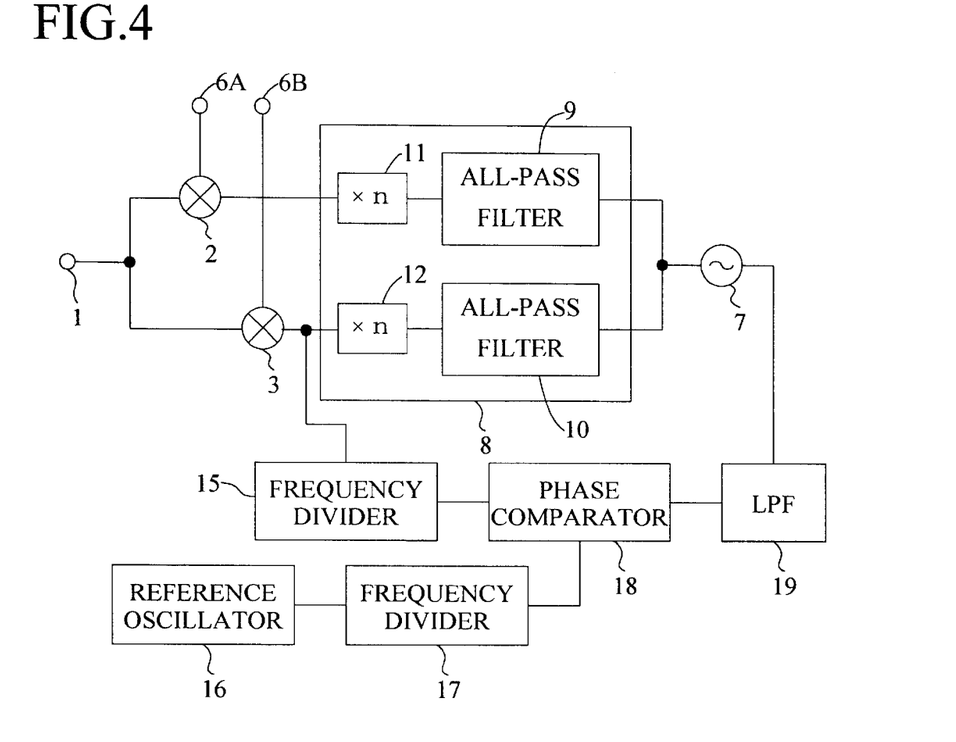
FIG. 4 is a block diagram showing the internal configuration of the demodulator of a fourth embodiment of the invention.

A fourth embodiment of the present invention will be described with reference to the drawings. FIG. 4 is a block diagram showing the internal configuration of the demodulator of this embodiment. In the demodulator shown in FIG. 4, such circuit elements as are used for the same purposes as in the demodulator shown in FIG. 3 are identified with the same reference numerals, and their detailed descriptions will not be repeated. The modulator of this embodiment, like that of the third embodiment, differs from that of the first embodiment (FIG. 1) only in that it is additionally provided with a phase-locked loop (PLL).

In the demodulator shown in FIG. 4, the signal output from the n-times frequency multiplier 12 is fed to the frequency divider 15. That is, the local oscillator 7, the all-pass filter 10, the n-times frequency multiplier 12, the frequency dividers 15 and 17, the reference oscillator 16, the phase comparator 18, and the low-pass filter 19 together constitute a PLL. Here, if it is assumed that the frequency division factor of the frequency divider 17 is 1/Nx, i.e. the same as in the third embodiment, then the frequency division factor of the frequency divider 15 is 1/(n×N), in contrast to 1/N in the third embodiment. On the other hand, if it is assumed that the frequency division factor of the frequency divider 15 is 1/N, i.e. the same as in the third embodiment, then the frequency division factor of the frequency divider 17 is n/Nx, in contrast to 1/Nx in the third embodiment. Also in this embodiment, as in the third embodiment, the frequency divider 15 or 17 may be a variable-frequency-division-factor frequency divider so that a desired received signal to be subjected to quadrature demodulation can be selected from among a plurality of received signals fed in via the input terminal 1.

Fifth Embodiment

Figure 5:
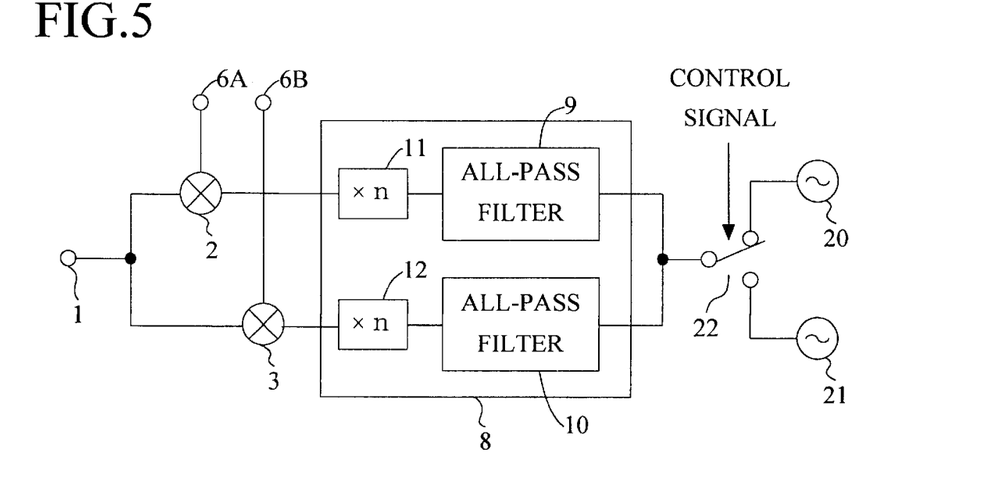
FIG. 5 is a block diagram showing the internal configuration of the demodulator of a fifth embodiment of the invention.

A fifth embodiment of the present invention will be described with reference to the drawings. FIG. 5 is a block diagram showing the internal configuration of the demodulator of this embodiment. In the demodulator shown in FIG.

5, such circuit elements as are used for the same purposes as in the demodulator shown in FIG. 1 are identified with the same reference numerals, and their detailed descriptions will not be repeated.

The demodulator shown in FIG. 5 is provided with local oscillators 20 and 21 and a selector switch 22 so that, in accordance with the frequency of a received signal, one of the local oscillation signals output from the local oscillators 20 and 21 is selected and fed to the all-pass filters 9 and 10 provided within the phase shifter 8. In this circuit configuration, for example, the local oscillator 20 is made to oscillate a local oscillation signal having a frequency in a range from 950 to 1450 [MHz] and the local oscillator 21 is made to oscillate a local oscillation signal having a frequency in a range from 1450 to 2150 [NHz].

Thus, for example, when a received signal having a frequency in a lower frequency range from 950 to 1450 [MHz] is to be demodulated, the local oscillation signal output from the local oscillator 20 is selected by the selector switch 22 and fed to the phase shifter 8, and, when a received signal having a frequency in a higher frequency range from 1450 to 2150 [MHz] is to be demodulated, the local oscillation signal output from the local oscillator 21 is selected by the selector switch 22 and fed to the phase shifter 8. This modulator, when incorporated in a direct conversion tuner or the like, offers coverage of a wide frequency range. Moreover, providing the modulator with a plurality of oscillators helps reduce the frequency range to be covered by each oscillator, and thus makes the designing of the oscillators easy.

Sixth Embodiment

Figure 6:
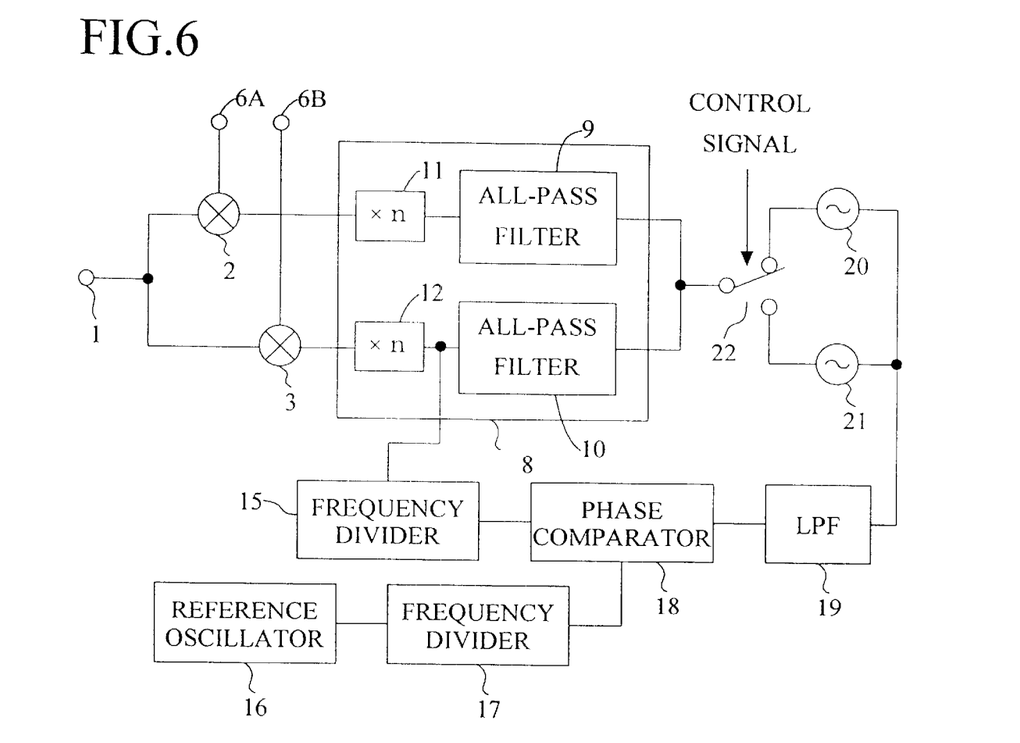
FIG. 6 is a block diagram showing the internal configuration of the demodulator of a sixth embodiment of the invention.

A sixth embodiment of the present invention will be described with reference to the drawings. FIG. 6 is a block diagram showing the internal configuration of the demodulator of this embodiment. In the demodulator shown in FIG. 6, such circuit elements as are used for the same purposes as in the demodulator shown in FIG. 3 are identified with the same reference numerals, and their detailed descriptions will not be repeated.

The modulator shown in FIG. 6 is a version of the modulator of the third embodiment (FIG. 3) modified by additionally providing it with local oscillators 20 and 21 and a selector switch 22 just like those used in the fifth embodiment. Here, the local oscillators 20 and 21 and the selector switch 22 operate in the same manner as in the fifth embodiment. In this modulator configured as described above, the frequency divider 15 or 17 is a variable frequency divider, and the control signal used to make the frequency divider 15 or 17 vary its frequency division factor is fed also to the selector switch 22 so that one of the local oscillators 20 and 21 is selected in accordance with the frequency division factor. The circuit configuration of the modulator of this embodiment may be applied also to the modulator of the fourth embodiment (FIG. 4).

As described above, in a phase shifter according to the present invention, a local oscillation signal having a frequency of f/n is subjected first to necessary signal processing and then to n-times frequency multiplication so as to be made into two signals having a frequency of f and separated in phase by 90° from each other. This helps lower the operation frequency of the circuits that are expected to produce a phase difference with high accuracy. As a result, it is possible to reduce the influence, on such accuracy, of the frequency-dependent constants of the circuit elements used in the phase shifter, and, with the lowering of the operation frequency, it is possible to reduce the circuit currents. Moreover, in a demodulator employing such a phase shifter, the frequency of the local oscillation signal generated by a local oscillator differs from the frequency of a received signal fed in from outside. This makes it easy to suppress leakage of the local oscillation signal toward the received signal terminal, and also helps prevent fluctuation of the local oscillation signal of the local oscillator resulting from reception of an intense received signal.

What is claimed is:

1. A phase shifter comprising:
   a phase shifting portion that produces, from a local oscillation signal having a frequency of f/n (where n is a natural number), two signals separated in phase by 90/n degrees from each other; and
   a frequency multiplying portion that performs frequency multiplication on each of the two signals output from the phase shifting portion by a frequency multiplication factor of n so that a frequency of those signals is converted from f/n to f and so that those signals are separated in phase by 90 degrees from each other.

2. A phase shifter comprising:
   a phase shifting portion that produces, from a local oscillation signal having a frequency of f/2, two signals separated in phase by 45 degrees from each other; and
   a frequency multiplying portion that performs frequency multiplication on each of the two signals output from the phase shifting portion by a frequency multiplication factor of 2 so that a frequency of those signals is converted from f/2 to f and so that those signals are separated in phase by 90 degrees from each other.

3. A phase shifter comprising:
   a first phase shifting portion that produces from a local oscillation signal a first signal separated in phase by θ degrees therefrom;
   a second phase shifting portion that produces from the local oscillation signal a second signal separated in phase by (θ+45) degrees therefrom;
   a first multiplier that multiplies the first signal output from the first phase shifting portion by itself; and
   a second multiplier that multiplies the second signal output from the second phase shifting portion by itself.

4. A demodulator comprising:
   a phase shifter, the phase shifter comprising: a phase shifting portion that produces, from a local oscillation signal having a frequency of f/n (where n is a natural number), two signals separated in phase by 90/n degrees from each other; and
   a frequency multiplying portion that performs frequency multiplication on each of the two signals output from the phase shifting portion by a frequency multiplication factor of n so that a frequency of those signals is converted from f/n to f and so that those signals are separated in phase by 90 degrees from each other;
   a first mixer that produces an I base band signal by multiplying a received signal fed in from outside by one of the two signals output from the phase shifter; and
   a second mixer that produces a Q base band signal by multiplying the received signal fed in from outside by the other of the two signals output from the phase shifter.

5. A demodulator as claimed in claim 4,
   wherein the local oscillation signal is generated by a local oscillator built as a voltage-controlled oscillator, and wherein the local oscillator is controlled by a phase-locked loop that uses one of the two signals output from the phase shifter.

6. A demodulator as claimed in claim 5,
wherein the phase-locked loop comprises:
   the local oscillator;
   the phase shifter;
   a reference oscillator that outputs a reference signal having a predetermined frequency;
   a variable frequency divider that performs frequency division on one of the two signal output from the phase shifter by a desired frequency division factor;
   a phase comparator that compares a phase of one of the two signals subjected to frequency division by the variable frequency divider with a phase of the reference signal output from the reference oscillator; and
   a filter that permits, among signals output from the phase comparator, a control signal with which to control the local oscillator to pass therethrough.

7. A demodulator as claimed in claim 6,
wherein the local oscillator comprises a first local oscillator that generates a local oscillation signal in a lower frequency range and a second local oscillator that generates a local oscillation signal in a higher frequency range,
wherein a signal selector is provided that chooses between the local oscillation signal output from the first local oscillator and the local oscillation signal output from the second local oscillator in order to feed one of these local oscillation signals to the mixers for synchronization with the received signal, and
wherein which local oscillation signal the signal selector chooses is determined in accordance with the frequency division factor of the variable frequency divider.

8. A demodulator as claimed in claim 5,
wherein the phase-locked loop comprises:
   the local oscillator;
   the phase shifter;
   a reference oscillator that outputs a reference signal having a predetermined frequency;
   a variable frequency divider that performs frequency division on the reference signal output from the reference oscillator by a desired frequency division factor;
   a phase comparator that compares a phase of the reference signal subjected to frequency division by the variable frequency divider with a phase of one of the two signals output from the phase shifter; and
   a filter that permits, among signals output from the phase comparator, a control signal with which to control the local oscillator to pass therethrough.

9. A demodulator as claimed in claim 8,
wherein the local oscillator comprises a first local oscillator that generates a local oscillation signal in a lower frequency range and a second local oscillator that generates a local oscillation signal in a higher frequency range,
wherein a signal selector is provided that chooses between the local oscillation signal output from the first local oscillator and the local oscillation signal output from the second local oscillator in order to feed one of these local oscillation signals to the mixers for synchronization with the received signal, and
wherein which local oscillation signal the signal selector chooses is determined in accordance with the frequency division factor of the variable frequency divider.

10. A demodulator as claimed in claim 4,
wherein a local oscillator comprises a first local oscillator that generates the local oscillation signal in a lower frequency range and a second local oscillator that generates the local oscillation signal in a higher frequency range, and
wherein a signal selector is provided that chooses between the local oscillation signal output from the first local oscillator and the local oscillation signal output from the second local oscillator in order to feed one of these local oscillation signals to the mixers for synchronization with the received signal.

11. A demodulator comprising:
a phase shifter, the phase shifter comprising:
   a phase shifting portion that produces, from a local oscillation signal having a frequency of f/2, two signals separated in phase by 45 degrees from each other; and
   a frequency multiplying portion that performs frequency multiplication on each of the two signals output from the phase shifting portion by a frequency multiplication factor of 2 so that a frequency of those signals is converted from f/2 to f and so that those signals are separated in phase by 90 degrees from each other;
a first mixer that produces an I baseband signal by multiplying a received signal fed in from outside by one of the two signals output from the phase shifter; and
a second mixer that produces a Q baseband signal by multiplying the received signal fed in from outside by the other of the two signals output from the phase shifter.

12. A demodulator as claimed in claim 11,
wherein the local oscillation signal is generated by a local oscillator built as a voltage-controlled oscillator, and
wherein the local oscillator is controlled by a phase-locked loop that uses one of the two signals output from the phase shifter.

13. A demodulator as claimed in claim 12,
wherein the phase-locked loop comprises:
   the local oscillator;
   the phase shifter;
   a reference oscillator that outputs a reference signal having a predetermined frequency;
   a variable frequency divider that performs frequency division on one of the two signals output from the phase shifter by a desired frequency division factor;
   a phase comparator that compares a phase of one of the two signals subjected to frequency division by the variable frequency divider with a phase of the reference signal output from the reference oscillator; and
   a filter that permits, among signals output from the phase comparator, a control signal with which to control the local oscillator to pass therethrough.

14. A demodulator as claimed in claim 13,
wherein the local oscillator comprises a first local oscillator that generates the local oscillation signal in a lower frequency range and a second local oscillator that generates the local oscillation signal in a higher frequency range,
wherein a signal selector is provided that chooses between the local oscillation signal output from the first local oscillator and the local oscillation signal output from the second local oscillator in order to feed one of these local oscillation signals to the mixers for synchronization with the received signal, and wherein which local oscillation signal the signal selector chooses is determined in accordance with the frequency division factor of the variable frequency divider.

15. A demodulator as claimed in claim 12, wherein the phase-locked loop comprises:
the local oscillator;
the phase shifter;
a reference oscillator that outputs a reference signal having a predetermined frequency;
a variable frequency divider that performs frequency division on the reference signal output from the reference oscillator by a desired frequency division factor;
a phase comparator that compares a phase of the reference signal subjected to frequency division by the variable frequency divider with a phase of one of the two signals output from the phase shifter; and
a filter that permits, among signals output from the phase comparator, a control signal with which to control the local oscillator to pass therethrough.

16. A demodulator as claimed in claim 15, wherein the local oscillator comprises a first local oscillator that generates the local oscillation signal in a lower frequency range and a second local oscillator that generates the local oscillation signal in a higher frequency range, wherein a signal selector is provided that chooses between the local oscillation signal output from the first local oscillator and the local oscillation signal output from the second local oscillator in order to feed one of these local oscillation signals to the mixers for synchronization with the received signal, and wherein which local oscillation signal the signal selector chooses is determined in accordance with the frequency division factor of the variable frequency divider.

17. A demodulator as claimed in claim 11, wherein a local oscillator comprises a first local oscillator that generates the local oscillation signal in a lower frequency range and a second local oscillator that generate the local oscillation signal in a higher frequency range, and wherein a signal selector is provided that chooses between the local oscillation signal output from the first local oscillator and the local oscillation signal output from the second local oscillator in order to feed one of these local oscillation signals to the mixers for synchronization with the received signal.

18. A demodulator comprising:

a phase shifter, the phase shifter comprising:
a first phase shifting portion that produces from a local oscillation signal a first signal separated in phase by θ degrees therefrom;
a second phase shifting portion that produces from the local oscillation signal a second signal separated in phase by (θ+45) degrees therefrom;
a first multiplier that multiplies the first signal output from the first phase shifting portion by itself; and
a second multiplier that multiplies the second signal output from the second phase shifting portion by itself;

a first mixer that produces an I baseband signal by multiplying a received signal fed in from outside by one of the two signals output from the phase shifter; and a second mixer that produces a Q baseband signal by multiplying the received signal fed in from outside by the other of the two signals output from the phase shifter.

19. A demodulator as claimed in claim 18, wherein the local oscillation signal is generated by a local oscillator built as a voltage-controlled oscillator, and wherein the local oscillator is controlled by a phase-locked loop that uses one of the two signals output from the phase shifter.

20. A demodulator as claimed in claim 19, wherein the phase-locked loop comprises:
the local oscillator;
the phase shifter;
a reference oscillator that outputs a reference signal having a predetermined frequency;
a variable frequency divider that performs frequency division on the signals output from the phase shifter by a desired frequency division factor;
a phase comparator that compare a phase of one of the two signals subjected to frequency division by the variable frequency divider with a phase of the reference signal output from the reference oscillator; and
a filter that permits, among signals output from the phase comparator, a control signal with which to control the local oscillator to pass therethrough.

21. A demodulator as claimed in claim 20, wherein the local oscillator comprises a first local oscillator that generates the local oscillation signal in a lower frequency range and a second local oscillator that generates the local oscillation signal in a higher frequency range, wherein a signal selector is provided that chooses between the local oscillation signal output from the first local oscillator and the local oscillation signal output from the second local oscillator in order to feed one of these local oscillation signals to the mixers for synchronization with the received signal, and wherein which local oscillation signal the signal selector chooses is determined in accordance with the frequency division factor of the variable frequency divider.

22. A demodulator as claimed in claim 19, wherein the phase-locked loop comprises:
the local oscillator;
the phase shifter;
a reference oscillator that outputs a reference signal having a predetermined frequency;
a variable frequency divider that performs frequency division on the reference signal output from the reference oscillator by a desired frequency division factor;
a phase comparator that compares a phase of the reference signal subjected to frequency division by the variable frequency divider with a phase of one of the two signals output from the phase shifter; and
a filter that permits, among signals output from the phase comparator, a control signal with which to control the local oscillator to pass therethrough.

23. A demodulator as claimed in claim 22, wherein the local oscillator comprises a first local oscillator that generates the local oscillation signal in a lower frequency range and a second local oscillator that generates the local oscillation signal in a higher frequency range, wherein a signal selector is provided that chooses between the local oscillation signal output from the first local oscillator and the local oscillation signal output from the second local oscillator in order to feed one of these local oscillation signals to the mixers for synchronization with the received signal, and wherein which local oscillation signal the signal selector chooses is determined in accordance with the frequency division factor of the variable frequency divider.

24. A demodulator as claimed in claim 18, wherein the local oscillator comprises a first local oscillator that generates the local oscillation signal in a lower frequency range and a second local oscillator that generates the local oscillation signal in a higher frequency range, and wherein a signal selector is provided that chooses between the local oscillation signal output from the first local oscillator and the local oscillation signal output from the second local oscillator in order to feed one of these local oscillation signals to the mixers for synchronization with the received signal.

* * * * *